United States Patent [19]
Gersbach

[11] Patent Number: 6,031,403
[45] Date of Patent: *Feb. 29, 2000

[54] PULL-UP AND PULL-DOWN CIRCUITS

[75] Inventor: John Edwin Gersbach, Burlington, Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/748,453

[22] Filed: Nov. 13, 1996

[51] Int. Cl.[7] .................................................. H03K 3/037
[52] U.S. Cl. ......................... 327/206; 327/208; 327/199; 327/219; 327/198; 327/210
[58] Field of Search ..................................... 327/208, 209, 327/210, 199, 200, 217, 215, 198, 206, 219

[56] References Cited

U.S. PATENT DOCUMENTS

| | | | |
|---|---|---|---|
| 4,558,241 | 12/1985 | Suzuki et al. | 307/530 |
| 4,743,841 | 5/1988 | Takeuchi | 324/73 R |
| 4,872,141 | 10/1989 | Plus et al. | 365/154 |
| 4,933,899 | 6/1990 | Gibbs | 365/177 |
| 4,970,454 | 11/1990 | Stambaugh et al. | 324/73.1 |
| 5,057,774 | 10/1991 | Verhelst et al. | 324/158 R |
| 5,189,640 | 2/1993 | Huard | 365/154 |
| 5,321,354 | 6/1994 | Ooshima et al. | 324/158 R |
| 5,332,973 | 7/1994 | Brown et al. | 324/537 |
| 5,353,248 | 10/1994 | Gupta | 365/154 |
| 5,371,457 | 12/1994 | Lipp | 324/158.1 |
| 5,383,194 | 1/1995 | Sloan et al. | 371/22.1 |
| 5,384,504 | 1/1995 | Dickinson et al. | 327/51 |
| 5,392,293 | 2/1995 | Hsue | 371/15.1 |
| 5,406,134 | 4/1995 | Menut | 327/203 |
| 5,444,408 | 8/1995 | Merritt | 327/306 |
| 5,467,038 | 11/1995 | Motley et al. | 327/185 |
| 5,648,930 | 7/1997 | Randazzo | 365/185.07 |

FOREIGN PATENT DOCUMENTS

| | | | |
|---|---|---|---|
| 360241320 | 11/1985 | Japan | 327/198 |
| 405167403 | 7/1993 | Japan | 327/208 |

*Primary Examiner*—Timothy P. Callahan
*Assistant Examiner*—An T. Luu
*Attorney, Agent, or Firm*—Schmeiser, Olsen & Watts; Eugene I. Shkurko

[57] ABSTRACT

According to the preferred embodiment of the present invention pull-up/pull-down circuits are provided that use transistors with different threshold voltages to assure power-up to the correct predetermined state. These circuits have the ability to hold a node up or down while drawing very little DC current. In one embodiment a pull-up/pull-down circuit is provided that powers up to a first state with the pull-up node high and the pull-down node low, and that can be toggled from one state to another. A second embodiment provides a pull-up or pull-down circuit that powers up to the desired state and can be disabled by pulling the pull-up node low or pulling the pull-down node high. The circuits remain disabled until the power to the circuit is cycled.

18 Claims, 5 Drawing Sheets

PULL-UP AND PULL-DOWN CIRCUITS

BACKGROUND OF THE INVENTION

1. Technical Field

This invention generally relates to semiconductor devices, and more specifically relates to pull-up and pull-down circuits.

2. Background Art

Pull-up and pull-down circuits are used to pull-up and pull-down nodes to a DC level that are otherwise generally left unconnected when mounted to the final package. For example, pull-up circuits are commonly formed on semiconductor devices and connected to input nodes to allow the node to be pulled high without requiring an external circuit to pull the node up. The pull-up circuit can also be used to pull up a node that is externally connected but not driven. One use of a pull-up/pull-down circuit is in testing the semiconductor device. For example, a pull-up circuit can be used to pull a node high to test for excess leakage current. When testing is complete, these pull-up devices can be deactivated to allow the node to float for normal device operation.

Traditionally, P-channel transistors with the gate tied to ground are used in pull-up circuits while N-channel transistors with the gate tied to power supply are used in pull-down circuits.

The traditional P-channel transistor pull-up circuits with their gate tied to ground draw a current when being used to pull up a node that is being held externally to a low level. When the pull-up transistor circuit is used in a testing environment, the current can mask leakage current due to defects in the actual device and thus interfere with accurate testing.

Likewise, N-channel transistor pull-down circuits with their gate tied to power supply drain a similar current when used to pull down a node that is held externally to a high level. Again, this DC current path can interfere with testing measurements for leakage current on the device.

Because no acceptable solution has existed in the past, this problem is usually avoided by not measuring quiescent ground currents. However, it remains desirable to have the ability to measure quiescent current especially in diagnosing and debugging new designs. Thus, there remains a need for pull-up and pull-down circuits that bias a node without drawing DC current.

DISCLOSURE OF INVENTION

According to the present invention, pull-up/pull-down circuits are provided that use transistors with different threshold voltages to assure power-up to the correct predetermined state. Additionally, these circuits have the advantage of not drawing excessive current while pulling a node up or down.

In one embodiment a pull-up/pull-down circuit is provided that powers up to a first state with the pull-up node high and the pull-down node low, and that can be toggled from one state to another. A second embodiment provides a pull-up or pull-down circuit that powers up to the desired state and can be disabled by pulling the pull-up node low or pulling the pull-down node high. The circuits remain disabled until the power to the circuit is cycled.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment of the present invention overcomes the limitations of the prior art by providing a pull-up/pull-down circuit that comprises a latch circuit which is guaranteed to set to the correct state on power up and does not draw any DC current beyond normal leakage current levels found in CMOS circuits. The first embodiment allows the pull-up and pull-down nodes of the circuit to be toggled up and down and they will stay up or down respectively. Another embodiment provides a pull-up circuit that comprises a latch circuit that is also guaranteed to set at a pull-up state on power up and which normally draws very little DC current. This embodiment can further guarantee that if the pull-up node is pulled down, the pull-up transistor turns off and remains off until power is turned off and turned on again. This embodiment can also be used in a pull-down configuration. Thus, the two embodiments provide the ability to hold a node up or down while drawing no DC current.

Figure 1:
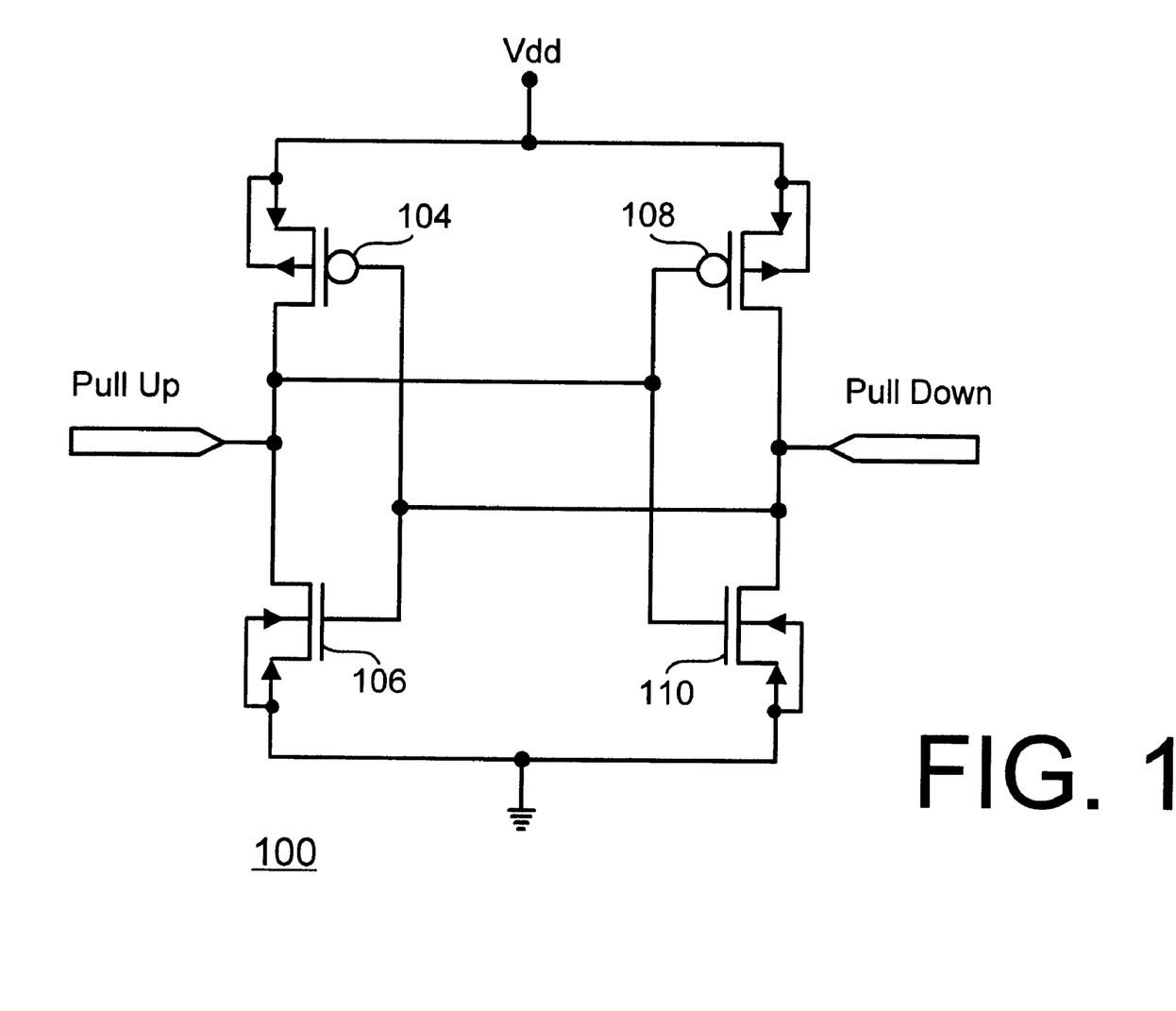
FIG. 1 is a schematic view of a pull-up/pull-down circuit 100 in accordance with a first embodiment of the present invention.

Turning now to FIG. 1, FIG. 1 is a schematic view of a pull-up/pull-down circuit 100 in accordance with a first embodiment of the present invention. The circuit 100 includes a first transistor 104, a second transistor 106, a third transistor 108 and a fourth transistor 110. First transistor 104 and second transistor 106 are connected in series between the power supply Vdd and ground. Furthermore, third transistor 108 and fourth transistor 110 are connected in series between the power supply Vdd and ground. A pull-up node is connected between first transistor 104 and second transistor 106. Likewise a pull-down node is connected between third transistor 108 and fourth transistor 110.

The gates of first transistor 104 and second transistor 106 are connected to the pull-down node and the gates of third transistor 108 and fourth transistor 110 are connected to the pull-up node. Thus, the transistors are arranged as two cross-coupled inverters that form a static latch.

First transistor 104 and third transistor 108 are preferably P-channel FETs, while second transistor 106 and fourth transistor 110 are preferably N-channel FETs. Second transistor 106 and third transistor 108 preferably are also selected to have a higher threshold voltage (Vt) than the first transistor 104 and the fourth transistor 110.

This higher threshold voltage can be accomplished in a variety of ways. For example, complementary gate doping can be used to increase the threshold voltage of second transistor 106 and third transistor 108 by an amount approximately equal to the band gap of silicon, or approximately one volt. Of course, other methods such as channel tailoring implants can be used to increase the threshold voltage.

Second transistor 106 and third transistor 108 preferably have higher gains than first transistor 104 and fourth transistor 110, typically by virtue of their respective sizes. In particular, first transistor 104 and fourth transistor 110 preferably have a larger width to length ratio than second transistor 106 and third transistor 108.

In operation, one of the two nodes, either the pull-up node or pull-down node would be connected to an appropriate node on the device, such as a input pin on the device. For example, assume the pull-down node is connected to an input pin. This being the case, upon power up the input tied to the pull-down node will be pulled low.

The initialization to the correct state is preferably accomplished by means of the threshold voltage difference between the transistors. In particular, as the power supply rises on power-up, the lower threshold transistors (104 and 110) will conduct first. Thus, these transistors will conduct first and prevent the other transistors (106 and 108) from conducting. With transistors 104 and 110 on, and transistors 106 and 108 off, the pull-down node will be pulled to ground and the pull-up node will be pulled to Vdd. Thus, the circuit 100 is designed to assure setting to the correct state on power up. Additionally, by virtue of the static latch configuration, the preferred embodiment has very low quiescent current flowing while operating to hold the nodes in the first state.

Furthermore, the circuit 100 is able to be set to a second state when it is desired for testing and other applications. Circuit 100 can be set to the second state by either pulling the pull-down node to Vdd or pulling the pull-up node to ground. If this occurs, transistors 106 and 108 will turn on and transistors 104 and 110 will be turned off. The circuit 100 will then hold at this second state until the node is pulled back. Additionally, the preferred embodiment has very low quiescent current flowing while operating to hold the nodes in the second state.

Since the transistors 104 and 110 are preferably standard sized transistors (i.e., the same size as the prior art pull-up transistors connected to a control voltage that provide pull-up and pull-down levels) they can be easily driven to this second state.

Transistors 106 and 108 are preferably selected to require small currents such that normal input current levels can drive the nodes to either voltage level without requiring large DC currents nor any logical control circuits. Transistors 106 and 108 should thus be sized such that they can be easily overcome.

Thus, circuit 100 functions as either a pull-up or pull-down circuit. Circuit 100 initializes to a first state with the pull-up node high and the pull-down node low. Furthermore, if circuit 100 is forced to a second state, with the pull-up node down and the pull-down node up, circuit 100 will hold that state until the node is forced back to its original state or the circuit is powered off and on again. Circuit 100 also has the advantage of drawing no DC current when in either state, and only a brief transient current during switching between states.

Figure 2:
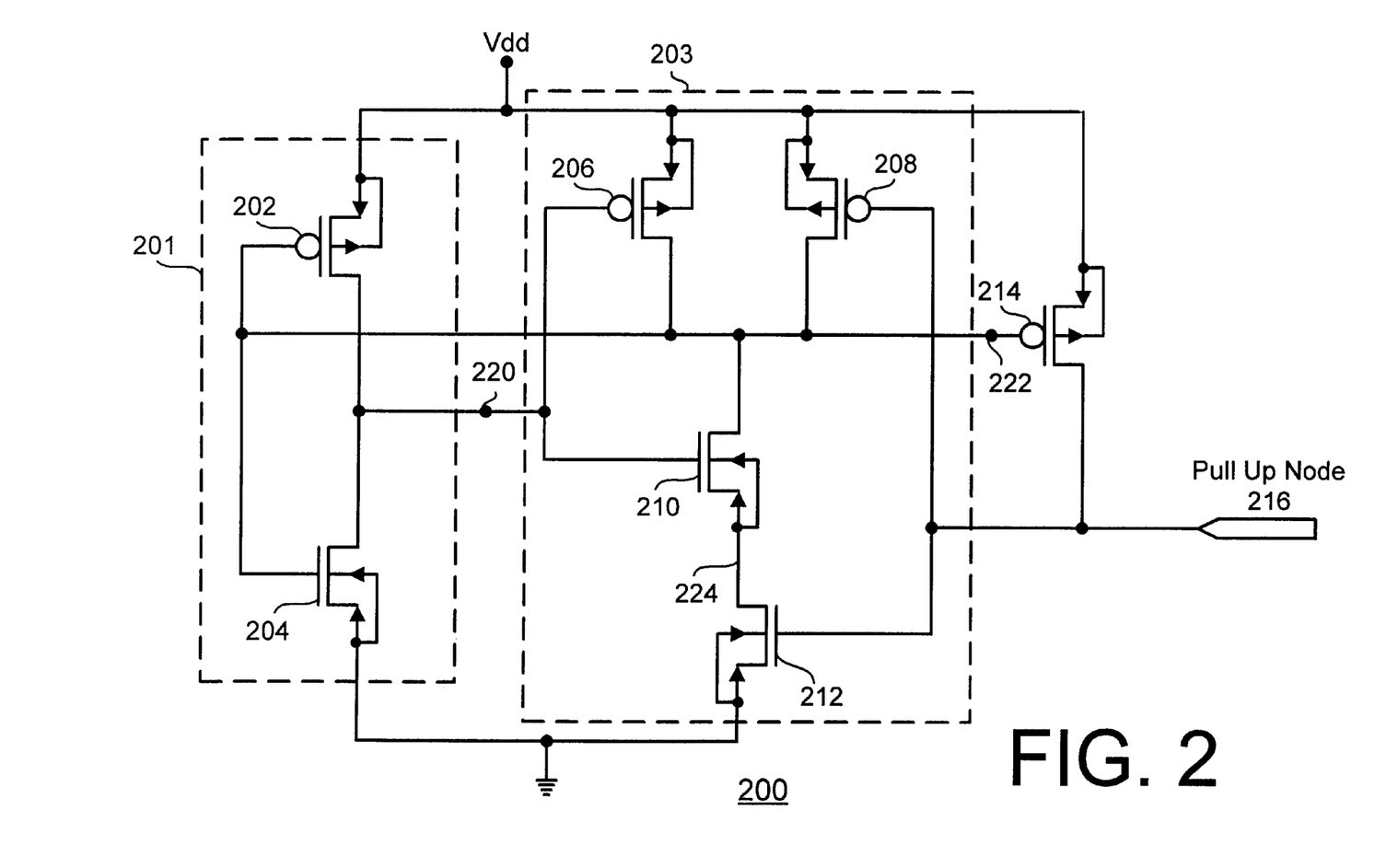
FIG. 2 is a schematic view of a pull-up circuit 200 in accordance with a second embodiment of the present invention.

Turning now to FIG. 2, FIG. 2 is a schematic view of a pull-up circuit 200. In general, pull-up circuit 200 comprises an inverter 201 and a NAND circuit 203 coupled together as a latch. Inverter 201 comprises transistors 202 and 204, with transistor 202 preferably comprising a P-channel transistor and transistor 204 preferably comprising an N-channel transistor. NAND circuit 203 comprises transistors 206, 208, 210 and 212. Transistors 206 and 208 are preferably P-channel transistors and transistors 210 and 212 are preferably N-channel transistors. Pull-up circuit 200 further comprises a level setting transistor 214, in this embodiment a pull-up transistor 214. The pull-up transistor 214 preferably comprises a P-channel device with its drain connected to a pull-up node 216. Pull-up circuit 200 is designed to initialize on power up to a known state with pull-up node 216 high. Pull-up node 216 stays high until it is pulled down. If pulled down the circuit will go to a high impedance state until reinitialized by power cycling. While in the high impedance state the node can be controlled by an external circuit without supplying any current to the pull-up circuit 200.

As in circuit 100, circuit 200 is preferably configured with some transistors having a higher threshold voltage to facilitate power-up to the correct state. In particular, transistors 204, 206 and 208 preferably have a higher threshold voltage. This higher threshold voltage is preferably facilitated by the use of complementary gate doping, but can also be accomplished by other techniques.

When circuit 200 is powered up, the signal nodes rise at about half the rate of the supply due to capacitive coupling through their gates. Because transistors 210, 212, and 202 have a lower threshold voltage, they are guaranteed to conduct first on power-up and this forces the other transistors off. This causes node 220 to go high and node 222 to go high. With node 222 low transistor 214 will conduct, forcing pull-up node 216 high.

After circuit 200 has been initialized, pull-up node 216 can be pulled down. Pulling down pull-up node 216 turns off transistor 212 and turns on transistor 208. This causes node 222 to go high. In inverter 201, transistor 204 turns on and pulls node 220 low. When node 220 goes low, transistor 210 is turned off. Thus, if and when pull-up node 216 goes high again circuit 200 will not change state. In particular, by pulling pull-up node 216 high, even though transistor 212 becomes inverted again and conducts, this simply pulls node 224 to ground and node 222 remains low because transistor 210 remains off. With node 222 high, transistor 214 is turned off. With transistor 214 off, pull-up node 216 behaves as an open circuit, and will not effect the device that it is coupled to. Thus, circuit 200 is very useful for placing a node in a known state for testing and other purposes while effectively disabling the pull-up circuit once pull-up node 216 gets driven low.

Figure 3:
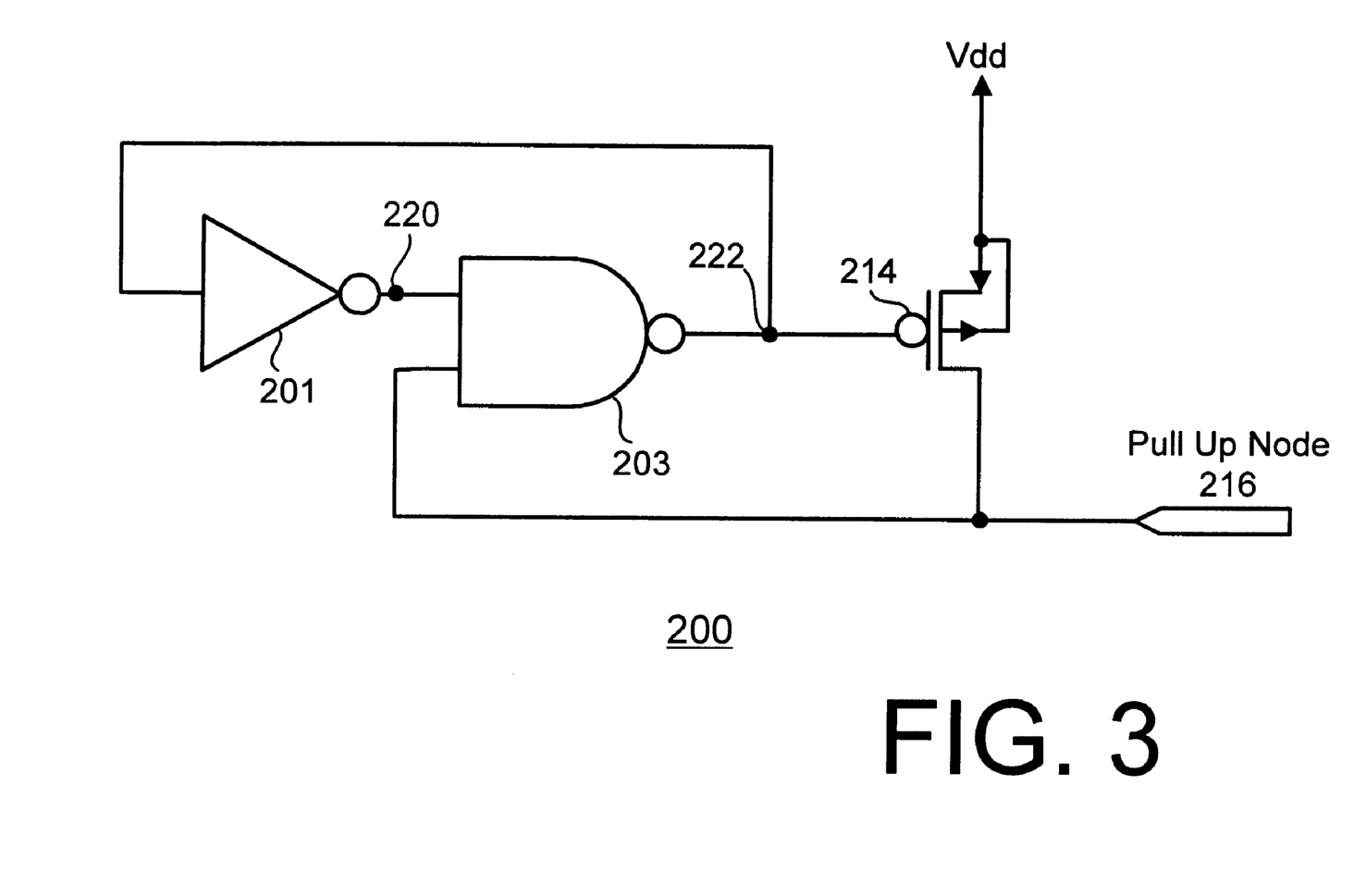
FIG. 3 is a second schematic view of pull-up circuit 200.

Turning now to FIG. 3, the operation of circuit 200 can also be described with reference to inverter 201 and NAND circuit 203. Node 220 is the output of inverter circuit 201 and is tied to the first input of NAND circuit 203. Likewise, node 222 is the output of NAND circuit 203 and pull-up node 216 is tied to the second input of NAND circuit 203. On the power-up of circuit 200 the NAND circuit 203 inputs both go high which causes the NAND 203 output to go low. This turns on transistor 214, holding pull-up node 216 high. Thus, on power up the circuit 200 automatically turns on driving the pull-up node high.

When the pull-up node 216 is pulled-down, the second input to the NAND circuit 203 is pulled low. This causes the output of NAND circuit 203 (node 222) to go high. This turns transistor 214 off, resulting in pull-up node 216 floating. Because the output of NAND circuit 203 is tied back to the input of the inverter 201, node 220 goes low. A low input on node 220 keeps the output of NAND circuit 203 high, which, in turn, keeps the input on node 220 low. Thus, driving pull-up node 216 low with external circuitry disables pull-up circuit 200.

If and when the pull-up node 216 is externally pulled up again, the second input to the NAND circuit 203 is pulled high. However, because the first input (node 220) remains low, the NAND 203 output (node 222) remains high and transistor 214 remains off. Thus, pulling pull-up node 216 back up after it has been pulled down has no effect on the state of the latch formed by NAND circuit 203 and inverter 201.

Figure 4:
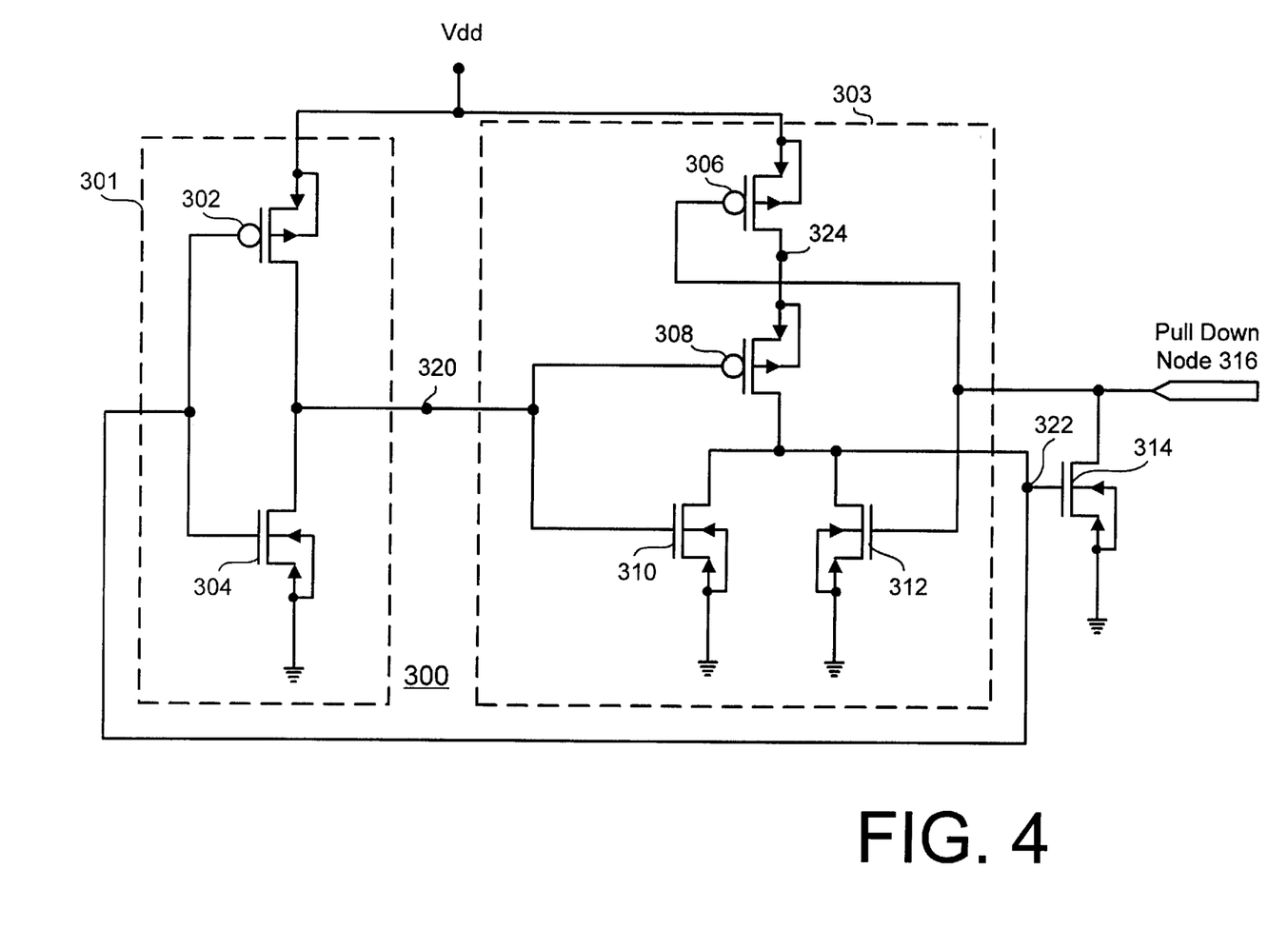
FIG. 4 is a schematic view of a pull-down circuit 300.

Turning now to FIG. 4, FIG. 4 is a schematic view of a pull-down circuit 300. In general, pull-down circuit 300 comprises an inverter 301 and a NOR circuit 303 coupled together as a latch. The inverter 301 comprises transistors 302 and 304, with transistor 302 preferably comprising a P-channel transistor and transistor 304 preferably comprising a N-channel transistor. The NOR circuit 303 comprises transistors 306, 308, 310 and 312. Transistors 306 and 308 are preferably P-channel transistors and transistors 310 and 312 are preferably N-channel transistors. Pull-down circuit 300 further comprises a level setting transistor 314, in this embodiment a pull-down transistor 314. Pull-down transistor 314 preferably comprises an N-channel device with its drain connected to a pull-down node 316.

Pull-down circuit 300 is designed to power up to a known state with pull-down node 316 low. Pull-down node 316 stays low until it is pulled up, and transistor 314 will then be disabled until power is cycled.

As in circuits 100 and 200, circuit 300 is preferably configured with some transistors having a higher threshold voltage to facilitate power-up to the desired state. In particular, transistors 302, 310 and 312 preferably have a higher threshold voltage. Again, this higher threshold voltage is preferably facilitated by the use of complementary gate doping, but can also be accomplished by other techniques.

When circuit 300 is powered up, the signal nodes rise at about half the rate of the supply due to capacitive coupling through their gates. Because transistors 304, 306, and 308 have a lower threshold voltage, they are guaranteed to conduct first on power-up and this forces the other transistors off. This causes node 320 to go low, and node 322 to go high. With node 322 high, transistor 314 will conduct, forcing pull-down node 316 down.

After circuit 300 has been initialized, pull-down node 316 can be pulled up (ie., driven high). Pulling up pull-down node 316 turns off transistor 306 and turns on transistor 312. This causes node 322 to go low. At inverter 301, transistor 304 turns off and transistor 302 turns on, pulling node 320 high. When node 320 goes high, transistor 308 is forced off. Thus, if and when pull-down node goes low again, there will be no effect on the circuit 300. In particular, even though transistor 306 turns on when pull-down node 316 is driven low, this simply pulls node 324 high and node 322 remains low. With node 322 low, transistor 314 is turned off. With transistor 314 off, pull-down node 316 behaves as an open circuit, and will not effect the device that it is coupled to.

Thus, circuit 300 operates in the same manner as pull-up circuit 200. In particular, this device powers up to an initial state with the pull-down node 316 pulled low, and when the pull-down 316 node is driven high, the circuit 300 remains in the high impedance state until power is cycled.

Figure 5:
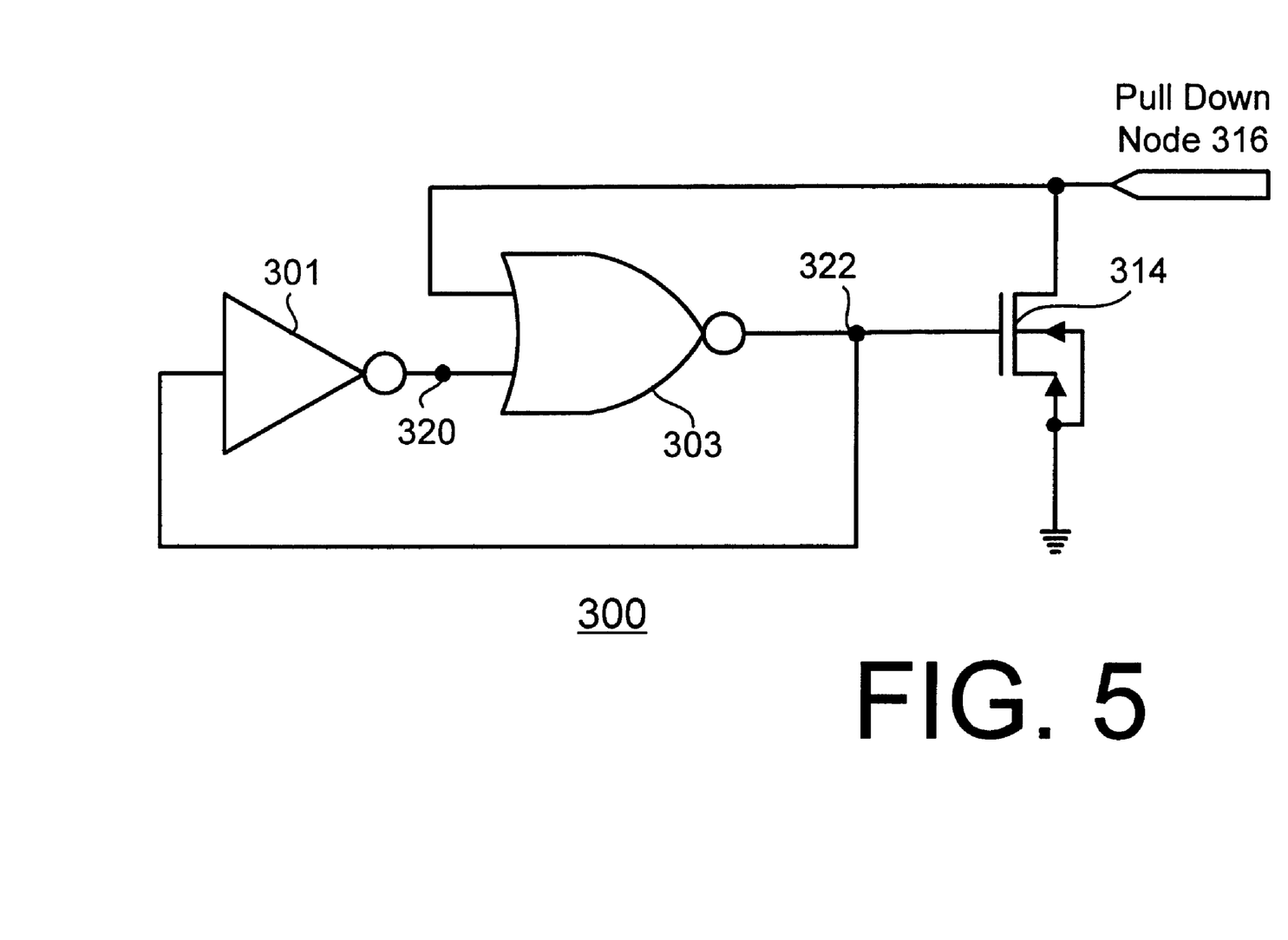
FIG. 5 is a second schematic view of pull-down circuit 300.

Turning now to FIG. 5, the operation of circuit 300 can also be described with reference to the inverter 301 and NOR circuit 303. Node 320 is the output of the inverter 301 and is tied to the first input of the NOR circuit 303. Likewise, node 322 is the output of the NOR circuit 303 is tied to the input of inverter 301 and the gate of transistor 314. The drain of transistor 314 is tied to the pull-down node 316 and to the second input of the NOR circuit 303. On the power-up of circuit 300 the NOR circuit 303 inputs both go low, causing the NOR circuit 303 output to go high. This causes transistor 314 to conduct, holding pull-down node 316 low. Thus, on power up the circuit 300 automatically turns on with the pull-down 316 node pulled low.

When the pull-down node 316 is driven high, the second input to the NOR circuit 303 is driven high. This causes the output of NOR circuit 303 (node 322) to go low. This turns the transistor 314 off and the pull-down node 316 floats. Because the output of NOR circuit 303 is tied back to the input of the inverter 301, node 320 is driven high, which maintains NOR circuit 303 in a steady state with pull-down node 316 undriven. Thus, pull-down circuit 300 is useful to initialize a signal to a low state on power-up, yet can be easily disabled by driving the node high.

If and when the pull-down node 316 is externally pulled down again, the second input to the NOR circuit 303 is pulled low. However, because the first input (node 320) remains high, the NOR circuit 303 output (node 322) remains low and transistor 314 remains off. Thus, pulling pull-down node 316 back down after it has been pulled up has no effect on the state of circuit 300.

Thus, in the first embodiment of the present invention, the pull-up and pull-down nodes of the circuit can be toggled up and down and they will stay up or down respectively. In the second embodiment, a pull-up (or pull-down) circuit comprises a latch circuit that is guaranteed to set at a pull-up state (or pull-down state) on power up and which normally draws no DC current beyond normal leakage current. This embodiment can further guarantee that if the pull-up node is driven low (or pull-down node driven high), the output transistor turns off and remains off until power is cycled.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductors, as is understood in the art.

I claim:

1. A circuit for setting the logic level of a node, the circuit comprising:

a latch circuit having an output, the latch circuit configured to power up with said output at a first state;

said latch circuit output coupled to said node and driving said node to a first logic level when said latch circuit output is at said first state; and wherein said latch circuit output is switched to a second state when said node is externally driven to a second logic level;

the latch circuit comprising:

a) an inverter, said inverter having an input and an output;

b) a NAND circuit, said NAND circuit having a first input, a second input and a output, said first input connected to the output of said inverter and wherein the output of said NAND circuit is the latch circuit output and is coupled to the inverter input and wherein said the second input of said NAND circuit is coupled to the node; and c) a level setting transistor having a gate and a drain, wherein said gate is tied to the output of said NAND circuit and wherein said drain is tied to said node and to the second input of said NAND circuit.

2. The level setting circuit of claim 1 wherein said level setting transistor is a P-type transistor and wherein said first state comprises said latch circuit output being low and said second state comprises said latch circuit output being high and wherein said first logic level comprises a high logic level and said second logic level comprises a low logic level and wherein said P-type transistor is turned off when said latch circuit output is at said second state.

3. The level setting circuit of claim 1 wherein:
   i) said inverter includes a first transistor and a second transistor connected in series, said second transistor having a lower threshold voltage than said first transistor; and
   ii) said NAND circuit includes a third transistor, a fourth transistor, a fifth transistor, and a sixth transistor, said third and fourth in parallel with each other and in series with said fifth and sixth transistors, said fifth and sixth transistors having a lower threshold voltage than said third and fourth transistors.

4. A circuit for setting the logic level of a node, the circuit comprising:
   a latch circuit having an output, the latch circuit configured to power up with said output at a first state;
   said latch circuit output coupled to said node and driving said node to a first logic level when said latch circuit output is at said first state; and
   wherein said latch circuit output is switched to a second state when said node is externally driven to a second logic level;
   the latch circuit comprising:
      a) an inverter, said inverter having an input and an output;
      b) a NOR circuit, said NOR circuit having a first input, a second input and a output, said first input connected to the output of said inverter and wherein the output of said NOR circuit is the latch circuit output is coupled to the inverter input and wherein said the second input of said NOR circuit is coupled to the node; and
      c) a level setting transistor having a gate and a drain, wherein said gate is tied to the output of said NOR circuit and wherein said drain is tied to the node and to the second input of said NOR circuit.

5. The level setting circuit of claim 4 wherein said level setting transistor is a N-type transistor and wherein said first state comprises said latch circuit output being high and said second state comprises said latch circuit output being low and wherein said first logic level comprises a low logic level and said second logic level comprises a high logic level and wherein said N-type transistor is turned off when said latch circuit output is at said second state.

6. The level setting circuit of claim 4 wherein:
   i) said inverter includes a first transistor and a second transistor connected in series, said second transistor having a lower threshold voltage than said first transistor; and
   ii) said NOR circuit includes a third transistor, a fourth transistor, a fifth transistor, and a sixth transistor, said fifth and sixth transistors in parallel with each other and in series with said third and fourth transistors, said third and fourth transistors having a lower threshold voltage than said fifth and sixth transistors.

7. A method for driving a circuit node to a predetermined first state on power-up with a minimum of DC quiescent current and for discontinuing the driving after power-up comprising the steps of:
   a) providing a latch circuit with an output coupled to the circuit node, the latch circuit comprising:
      i) an inverter, said inverter having an input and an output;
      ii) a NAND circuit, said NAND circuit having a first input, a second input and a output, said first input connected to the output of said inverter, said NAND circuit output connected to the input of said inverter;
      iii) a pull-up transistor having a gate and a drain, the gate of said pull-up transistor connected to the output of said NAND circuit and the drain of said pull-up transistor connected to the circuit node and the second input of said NAND circuit; and
      wherein the inverter powers up to a state with its output high and the NAND circuit powers up to a state with its output low such that on power-up said pull-up transistor is turned on and said circuit node is driven highs;
   b) powering-up said latch circuit, wherein on power-up of said latch circuit the output drives the circuit node to the first state; and
   c) externally driving the circuit node to a second state causing the latch circuit to discontinue driving the circuit node to the first state.

8. The method of claim 7 wherein the step of externally driving the circuit node to a second state comprises externally driving said circuit node low such that said second input of said NAND circuit is driven low causing said output of said NAND circuit to be driven high and said pull-up transistor is turned off and said input of said inverter is driven high.

9. A method for driving a circuit node to a predetermined first state on power-up with a minimum of DC quiescent current and for discontinuing the driving after power-up comprising the steps of:
   a) providing a latch circuit with an output coupled to the circuit node, the latch circuit comprising:
      i) an inverter, said inverting having an input and an output;
      ii) a NOR circuit, said NOR circuit having a first input, a second input and an output, said first input connected to the output of said inverter said NOR circuit output connected to the input of said inverter;
      iii) a pull-down transistor having a gate and a drain, the gate of said pull-down transistor connected to the output of said NOR circuit and the drain of said pull-down transistor connected to the circuit node and the second input of said NOR circuit; and
      wherein the inverter powers up to a state with its output low and the NOR circuit powers-up to a state with its output high such that on power-up said pull-down transistor is turned on and said circuit node is driven low,
   b) powering-up said latch circuit, wherein on power-up of said latch circuit the output drives the circuit node to the first state, and
   c) externally driving the circuit node to a second state causing the latch circuit to discontinue driving the circuit node to the first state.

10. The method of claim 9 wherein the step of externally driving the circuit node to a second state comprises driving said circuit node high such that said second input of said NOR circuit is driven high causing said output of said NOR circuit to be driven low and said pull-down transistor is turned off and said input of said inverter is driven low.

11. A pull-up circuit comprising:

a) an inverter, said inverter having an input and an output;
b) a NAND circuit, said NAND circuit having a first input, a second input and a output, said first input connected to the output of said inverter, said NAND circuit output connected to the input of said inverter;
c) a pull-up transistor having a gate and a drain, the gate of said pull-up transistor connected to the output of said NAND circuit and the drain of said pull-up transistor connected to a pull-up node and the second input of said NAND circuit; and
d) wherein the inverter is configured to power-up to a state with its output high and the NAND circuit is configured to power-up to a state with its output low such that on power-up said pull-up transistor is turned on and said pull-up node is driven high.

12. The pull-up circuit of claim 11 wherein the inverter includes a first transistor and a second transistor connected in series, said second transistor having a lower threshold voltage than said first transistor.

13. The pull-up circuit of claim 11 wherein said NAND circuit includes a third transistor, a fourth transistor, a fifth transistor, and a sixth transistor, said third and fourth in parallel with each other and in series with said fifth and sixth transistors, said fifth and sixth transistors having a lower threshold voltage than said third and fourth transistors.

14. A pull-up circuit comprising:
a) an inverter, said inverter having an output and an input and including a first transistor and a second transistor connected in series, said second transistor having a lower threshold voltage than said first transistor such that said inverter output goes high on power up of said pull-up circuit;
b) a NAND circuit having an output, a first input and a second input, said output of said NAND circuit connected to said inverter input, said first input receiving the output of said inverter, said NAND circuit including a third transistor, a fourth transistor, a fifth transistor, and a sixth transistor, said third and fourth in parallel with each other and in series with said fifth and sixth transistors, said fifth and sixth transistors having a lower threshold voltage than said third and fourth transistors such that said NAND circuit output goes low on power up of said pull-up circuit; and
c) a pull-up transistor, the gate of said pull-up transistor connected to the output of said NAND circuit such that said pull-up transistor conducts on power up of said pull-up circuit and the drain of said pull-up transistor connected to a pull-up node and said second input of said NAND circuit.

15. A pull-down circuit comprising:
a) an inverter, said inverter having an input and an output;
b) a NOR circuit, said NOR circuit having a first input, a second input and an output, said first input connected to the output of said inverter, said NOR circuit output connected to the input of said inverter;
c) a pull-down transistor having a gate and a drain, the gate of said pull-down transistor connected to the output of said NOR circuit and the drain of said pull-down transistor connected to a pull-down node and the second input of said NOR circuit; and
d) wherein the inverter is configured to power-up to a state with its output low and the NOR circuit is configured to power-up to a state with its output high such that on power-up said pull-down transistor is turned on and said pull-down node is driven low.

16. The pull-down circuit of claim 15 wherein said inverter includes a first transistor and a second transistor connected in series, said second transistor having a lower threshold voltage than said first transistor.

17. The pull-down circuit of claim 15 wherein said NOR circuit includes a third transistor, a fourth transistor, a fifth transistor, and a sixth transistor, said fifth and sixth transistors in parallel with each other and in series with said third and fourth transistors, said third and fourth transistors having a lower threshold voltage than said fifth and sixth transistors.

18. A pull-down circuit comprising:
a) an inverter, said inverter having an input and an output and including a first transistor and a second transistor connected in series, said second transistor having a lower threshold voltage than said first transistor such that said inverter output goes low on power up of said pull-down circuit;
b) a NOR circuit having an output, a first input and a second input, said output of said NOR circuit connected to said inverter input, said first input receiving the output of said inverter, said NOR circuit including a third transistor, a fourth transistor, a fifth transistor, and a sixth transistor, said fifth and sixth transistors in parallel with each other and in series with said third and fourth transistors, said third and fourth transistors having a lower threshold voltage than said fifth and sixth transistors such that said NOR circuit output goes high on power up of said pull-down circuit; and
c) a pull-down transistor, the gate of said pull-down transistor connected to said NOR circuit output such that said pull-down transistor conducts on power-up of said pull-down circuit and the drain of said pull-down transistor connected to a pull-down node and said second input of said NOR circuit.

* * * * *